United States Patent [19]

Daniels

[11] Patent Number: 4,670,711

[45] Date of Patent: Jun. 2, 1987

[54] HIGH-SPEED TRANSIENT PULSE HEIGHT COUNTER

[75] Inventor: James W. Daniels, Kent, Wash.

[73] Assignee: The Boeing Company, Seattle, Wash.

[21] Appl. No.: 697,954

[22] Filed: Feb. 4, 1985

[51] Int. Cl.[4] ............................................. G01R 23/16
[52] U.S. Cl. .................................. 324/77 A; 364/518
[58] Field of Search ............... 324/77 R, 77 A, 77 D, 324/77 E, 73 R, 73 AT, 77 G, 140 R, 103, 113; 307/229; 328/116; 340/172.5, 857; 364/518

[56] References Cited

U.S. PATENT DOCUMENTS

| | | | |
|---|---|---|---|
| 3,054,960 | 9/1962 | Pearlman | 328/116 |
| 3,125,721 | 3/1964 | Schumann | 324/103 |
| 3,219,803 | 11/1965 | Jones | 235/92 |
| 3,432,687 | 3/1969 | Emmer | 307/229 |
| 3,440,537 | 4/1969 | Warner et al. | 324/113 |
| 3,500,024 | 3/1976 | Stacy et al. | 235/92 |
| 3,603,769 | 9/1971 | Malcolm | 235/92 DP |
| 3,683,159 | 8/1972 | Welch et al. | 235/92 EA |
| 3,763,364 | 10/1973 | Deutsch et al. | 235/152 |
| 3,781,824 | 12/1973 | Caiati et al. | 340/172.5 |
| 3,925,650 | 12/1975 | Brown | 235/164 |
| 4,012,712 | 3/1977 | Nelligan | 340/857 |
| 4,053,831 | 10/1977 | Furukawa | 324/77 A |
| 4,074,190 | 2/1978 | Bunting | 324/77 A |
| 4,206,346 | 3/1980 | Hirosawa et al. | 235/92 PD |
| 4,215,413 | 6/1980 | Stark et al. | 364/510 |
| 4,241,406 | 12/1980 | Kennedy et al. | 364/518 |
| 4,283,678 | 8/1981 | Halter | 324/51 |
| 4,317,080 | 2/1982 | Acker | 328/151 |
| 4,355,348 | 10/1982 | Williams | 362/86 |
| 4,399,354 | 8/1983 | Schaeffer | 377/26 |

FOREIGN PATENT DOCUMENTS 0055866 4/1983 Japan .................. 324/77 A

*Primary Examiner*—Michael J. Tokar
*Attorney, Agent, or Firm*—Christensen, O'Connor, Johnson & Kindness

[57] ABSTRACT

A pulse height counter for counting the number of excursions of an incoming analog signal through each of a plurality of amplitude ranges. The pulse height counter automatically records not only the number of excursions through each amplitude level, but also records the number of amplitude excursions for each of a plurality of intervals. An analog input signal to be analyzed is synchronously applied to each of a plurality of comparators (VCO - VCF), which have reference voltages that are related so as to define predetermined amplitude ranges. During a count cycle, a counting circuit (CO - CF) receives the output signals from each of the comparators and produces a set of count data that indicates the number of occurrences of the analog input signal within each of the amplitude ranges. The count cycle is followed by a write cycle, during which the count values are stored in separate data bins, or event memories (MO - MF). The addresses of the memories are related to separate intervals during which count data for individual input signals can be stored. The addresses are shared by the memories so that, for a given interval, the count data for each of the amplitude ranges are stored at the same address but in a separate one of the memories. Thus, the count data for each of the amplitude ranges recorded during a predetermined interval may be recalled and displayed (18, 20, 22) during a readout mode of operation. The timing of the counting and writing cycles of operation is controlled by a count timer (32), a write timer (34), and an address counter (38) included in a timing and control circuit (10). Upon receipt of the analog input signal, the count timer is triggered to enable transfer of the outputs of the comparators to the counters. At the conclusion of the count cycle, the comparator outputs are disabled and the memories are enabled so that the count data may be transferred thereto. At the conclusion of the write cycle, the memories are disabled from receiving further count data and the counters are automatically reset so that new count data can be created upon receipt of a subsequent input signal. Substantially simultaneously with the resetting of the counters, the commonly shared address is incremented by 1 so that the count data for the next-received input signal is stored in the respective memories at the next successive storage location.

7 Claims, 5 Drawing Figures

HIGH-SPEED TRANSIENT PULSE HEIGHT COUNTER

BACKGROUND OF THE INVENTION

This invention relates generally to circuitry for analyzing the amplitude of analog input signal. More particularly, the invention concerns a high-speed pulse height counter that, during a predetermined time duration, counts the number of transient events at different levels of amplitude, stores the transient counts in digital memory, and resets itself to record the next pulse in a series of transient pulses.

In certain environments, it is desirable to analyze transient signals to determine the peak and intermediate levels of amplitude. This is generally accomplished by providing a multiple number of sensing circuits, each of which is arranged to sense a predetermined range of the expected amplitude of the incoming signal. The outputs of the sensing circuits are then counted to yield a distribution of the amplitude levels, or heights, of the analog input signal. Some of these pulse height counters employ analog-to-digial conversion to provide a digitized representation of the amplitude distribution of the analog signal. Because of the time required to perform the analog-to-digital conversion, this type of pulse height counter is not well suited for high-speed operation. In another type of pulse height counter, the sensing circuits comprise a plurality of analog comparators that are arranged to compare the amplitude of the incoming wave with reference levels that define the various predetermined amplitude ranges. The logical outputs of the comparators are then counted to provide the pulse height distribution of the incoming signal.

A common disadvantage of these known pulse height counters is their inability to provide an indication of the number of excursions of the input signal through each of the amplitude ranges during a predetermined time interval. Information concerning the amplitude distribution of a transient pulse on a time duration basis would advantageously provide an indication of the rate-of-rise and energy characteristics of the transient pulse. For example, such information would be important in determining the rating for devices that are to protect electronic circuitry from the effects of externally induced transients. As a result, a need exists for a pulse height counter that, in addition to counting the number of occurrences of an input signal at various amplitude levels, records the number of occurrences at each level per time span.

SUMMARY OF THE INVENTION

In accordance with the invention, there is provided a pulse height counter that records the number of transitions of an incoming analog signal through each of a plurality of amplitude ranges during a predetermined time duration. After storing these transient counts for an initial time duration, the pulse height counter automatically resets itself to record another analog input signal. Since the counting and storage of the pulse height counts is initiated only upon receipt of an analog input signal, the pulse height counter is capable of recording the transient counts for a plurality of transient pulses or for other analog input signals, regardless of the period of time therebetween.

The pulse height counter includes a comparison circuit having a plurality of comparators that are connected to synchronously receive an analog input signal. Each of the comparators compares the amplitude of the analog input signal with a predetermined reference voltage to produce a comparator output signal. The reference voltages of the comparators are related so as to define predetermined amplitude ranges for the analog input signal. In its preferred form, the invention is intended to produce count and duration data for bipolar transient pulses. For this purpose, some of the comparator reference voltages are positive, while the others are negative. As well, a balanced approach is preferred with an equal number of positive and negative reference levels and with equal voltage increments between successive steps. It is to be noted, however, that the invention readily lends itself to other than bipolar, balanced arrangements.

The invention also includes a counting circuit that is connected to receive the comparator output signals of each of the comparators, and in accordance therewith, produce a set of count data that indicates the number of occurrences of the analog input signal within each of the predetermined amplitude ranges. These count values are stored in separate data bins of a storage circuit. Timing and control means are included to control the operation of the comparison circuit, the counting circuit, and the storage circuit. When the analog input signal is received, the timing and control means, in sequence, enable the counting circuit to receive the comparator output signals and produce the count data, then disable the counting circuit from receiving the count data, and thereafter cause the storage circuit to store the count data in the data bins.

In the preferred form of the invention, the counting circuit and the storage circuit are arranged so that a resettable counter and a memory are provided for, and associated with, each of the comparators to form separate channels for each of the amplitude ranges. Thus, each of the resettable counters receives the comparator output signal from its associated comparator and, in accordance therewith, produces the count data for one of the amplitude ranges. This count data is then stored in the associated memory in one of a plurality of storage locations. In the most presently preferred form of the invention, the addresses of the memories are related to separate intervals, or time durations, during which count data for individual input signals can be stored. After the conclusion of the analysis of an initial input signal, a counter that stores the address for the storage locations is automatically incremented by one so that the count data for the next incoming signal is stored in the next successive storage location, as defined by the incremented address. By sharing the addresses, the count data for each of the other amplitude ranges are stored at the same address but in a separate one of the memories. Thus, the count data for each of the amplitude ranges recorded during a predetermined interval, i.e., at a predetermined commonly shared address, may be recalled and read out. In the readout mode of operation of the embodiment described herein, the count data are sequentially read out, on a storage location-to-storage location (amplitude range-to-amplitude range) and an interval-to-interval (address-to-address) basis and displayed. Rather than displaying the count data, the invention can be arranged so that the count data is automatically stored in nonvolatile mass storage media or transferred to a computer system.

Preferably, the timing of the counting and writing cycles of operation are controlled by a count timer, a write timer, and an address counter included in the timing and control means. Upon receipt of the analog input signal, the count timer is triggered to produce a count signal that simultaneously gates the output of each of the comparators to its associated counter. The write timer receives the count signal and, in accordance therewith, produces a write signal that is applied to the memories so that the count data for each amplitude range is simultaneously stored in the memory for each channel. Thus, there is a count interval during which the comparator output signals are transferred to and counted by the counters. At the conclusion of the count cycle, the write cycle is initiated to transfer the counts to the memories. The write signal is also applied to the counters so that, upon conclusion of the write cycle, the counters are automatically reset so that new count data can be created when a subsequent input signal is received.

The address counter produces the common address signal, which is applied to each of the memories to cause the memories to step, in simultaneous sequence through successive storage locations. It will be recalled that the addresses correspond with successive time intervals during which count data for independent signals is generated and stored. Since the period of time between successive signals may be very brief, it is important that the memories be readied for storage by quickly stepping them to their next, successive storage locations. To accomplish this, the trailing edge of the write signal causes the address counter to increment by one. It will thus be seen that the preferred form of the invention has a count cycle followed by a write cycle. At the conclusion of the count cycle, the comparator outputs are disabled and the memories are enabled so that the count data may be transferred thereto. At the conclusion of the write cycle, the memories are disabled from receiving further count data, the counters are reset, and the address counter is incremented by one. As a result, the pulse height counter is automatically reset to analyze the next incoming signal. In view of the foregoing, it will be seen that the invention provides a reasonably inexpensive and relatively simple device for automatically counting the respective excursions of a number of separate transient pulses through predetermined amplitude ranges during predetermined intervals. The device enables either periodic manual recall and display of recorded data or the automatic transfer of stored data to other storage or utilization devices.

BRIEF DESCRIPTION OF THE DRAWINGS

The invention can best be understood by the following portion of the specification taken in conjunction with the accompanying drawings in which.

DETAILED DESCRIPTION OF THE PREFERRED EMBODIMENT

Figure 1:
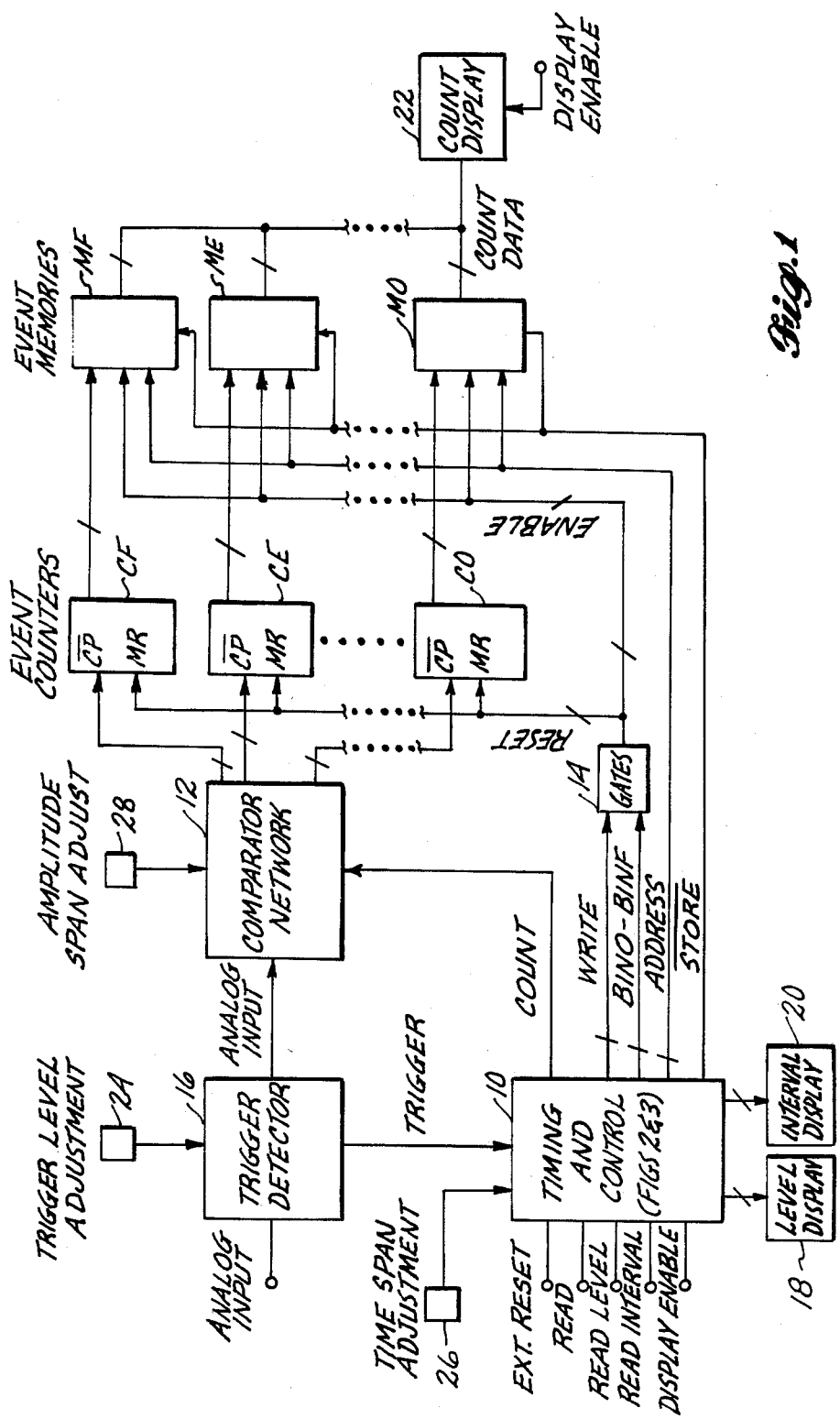
FIG. 1 is a block diagram of a pulse height counter in accordance with the invention.
Figure 2:
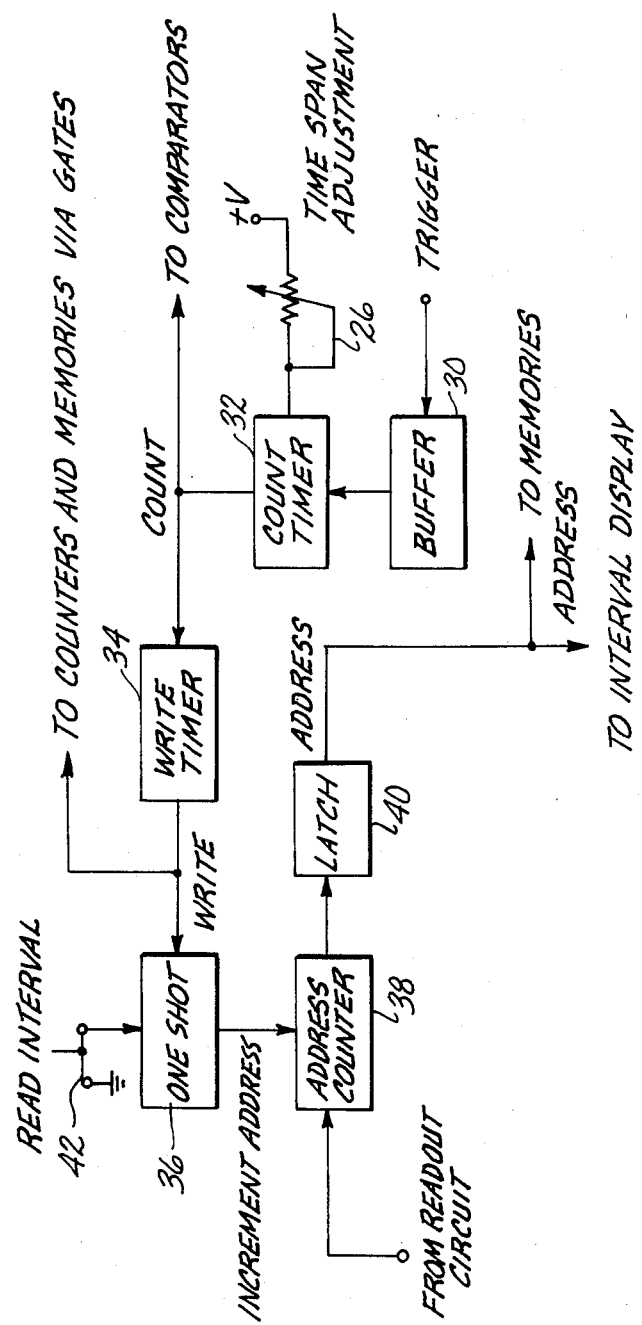
FIG. 2 is a block diagram of a timing circuit suitable for use in the pulse height counter of FIG. 1.
Figure 3:
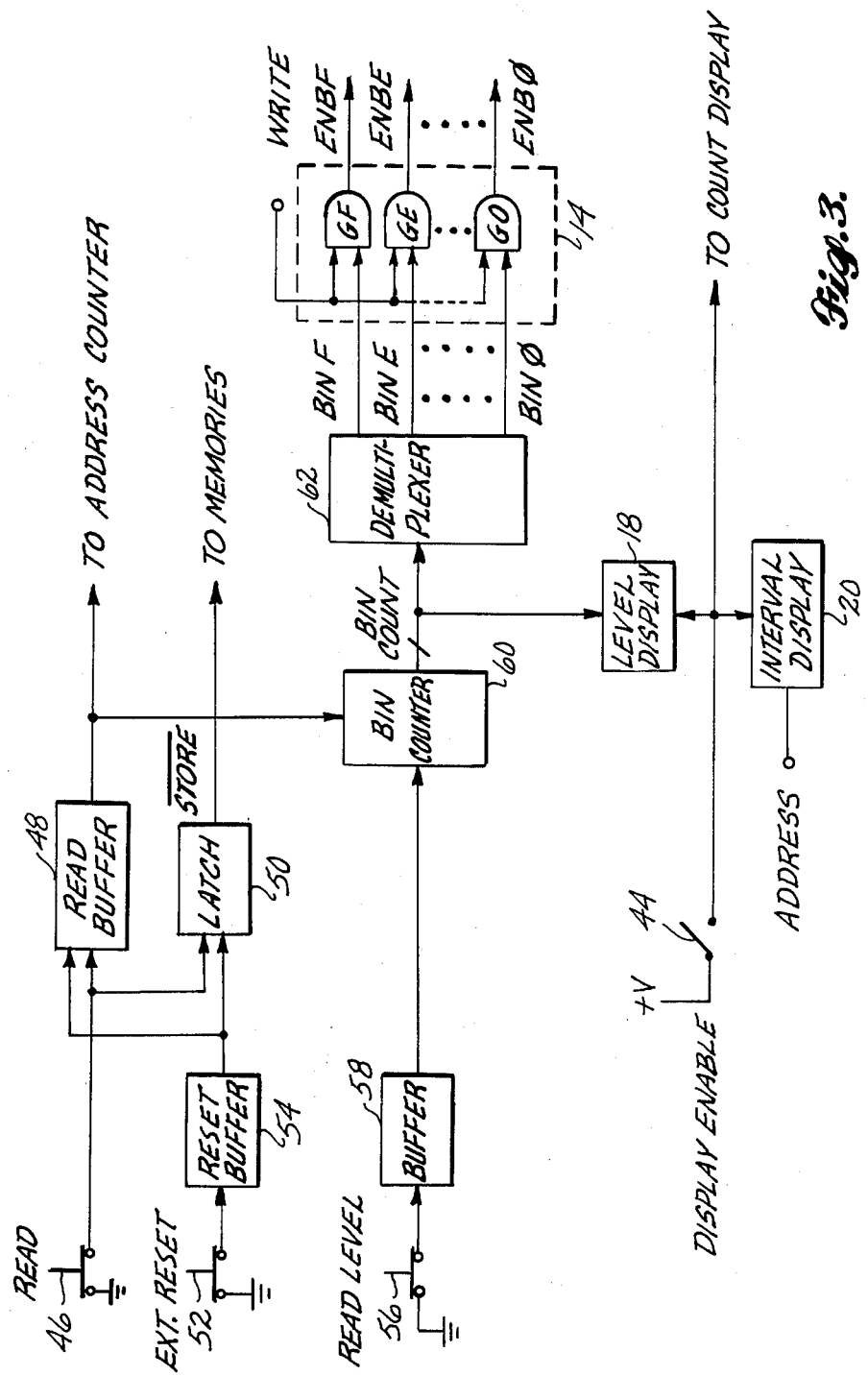
FIG. 3 is a block diagram of a readout control circuit suitable for use in the pulse height counter of FIG. 1.
Figure 4:
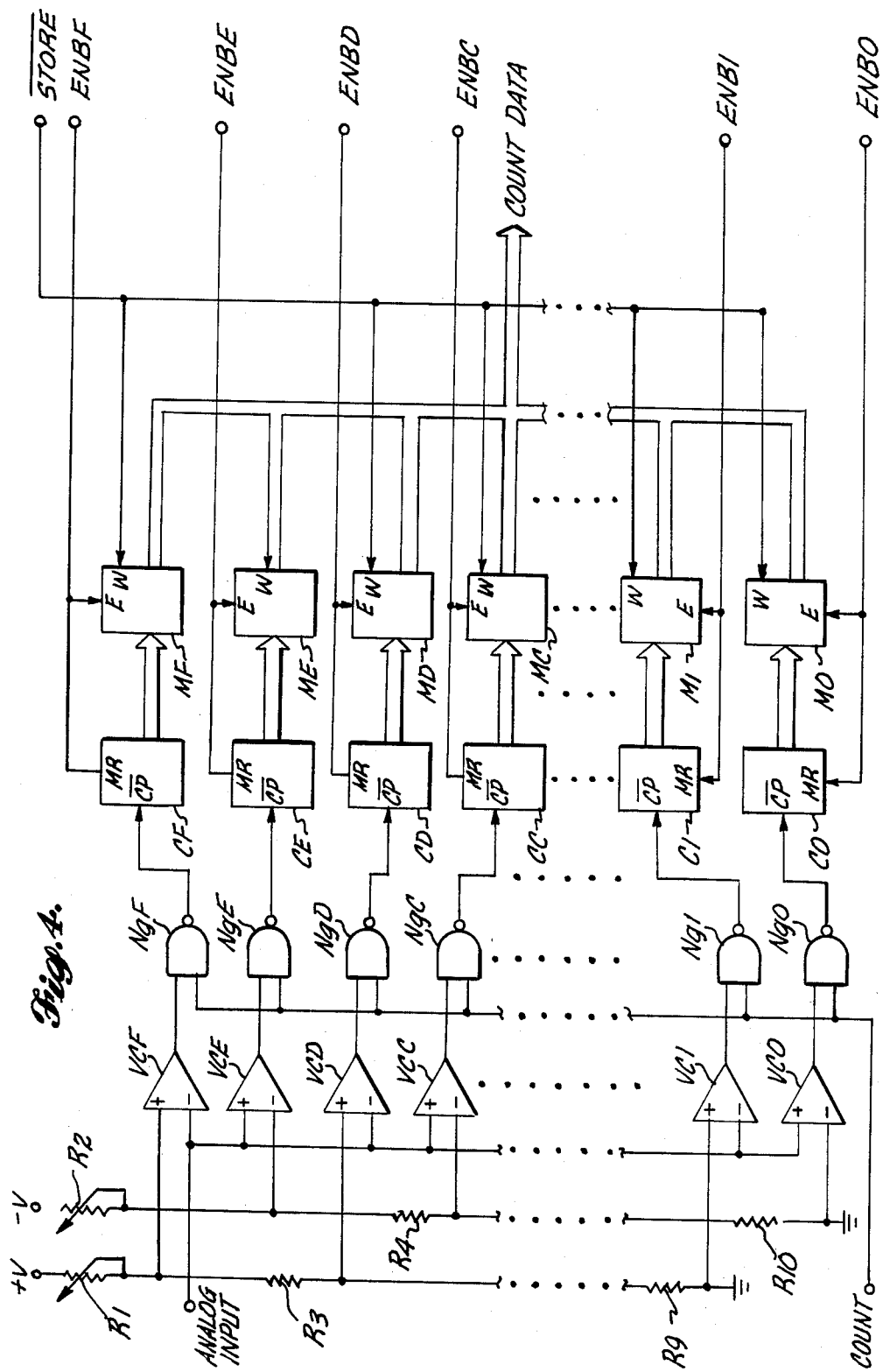
FIG. 4 is a detailed block diagram of a comparator network, event counters, and event memories suitable for use in the pulse height counter of FIG. 1.

Referring to FIG. 1, the inventive pulse height counter includes a timing and control circuit 10, a comparator network 12, a plurality of event counters designated C0 - CE, CF, and a plurality of event memories designated M0 - ME, MF; gates 14, a trigger detector 16; a level display 18; an interval display 20; and a count display 22. FIGS. 2 through 4 are block diagrams that illustrate in detail the major subsystems of FIG. 1. Prior to describing these subsystems, a brief description of the nature and operation of the pulse height counter of FIG. 1 is set forth.

The circuit shown in FIG. 1 is intended to analyze the amplitude excursions of each of a plurality of transient pulses, or events. These transients may be unipolar or bipolar in nature and may occur in unrelated time sequence, i.e., either close together or separated by a considerable amount of time. These incoming signals are designated ANALOG INPUT in FIG. 1 and are received by a trigger detector 16. The trigger detector is of the conventional type, which produces a digital TRIGGER signal whenever the amplitude of the ANALOG INPUT signal exceeds a predetermined threshold. Since bipolar transient events are of interest, the trigger detector is also of a dual-polarity type, having both positive and negative thresholds that are separately settable by a trigger level adjustment 24. Thus, whenever the ANALOG INPUT signal exceeds either the predetermined negative or positive threshold, the digital TRIGGER signal is produced. The trigger detector is also arranged to pass the incoming ANALOG INPUT signal to comparator network 12 for purposes that will be described below.

The TRIGGER signal produced by the trigger detector 16 is applied to the timing and control circuit 10 to initiate sequential count and write cycles during which the excursions of the ANALOG INPUT signal through a plurality of amplitude ranges are first counted and then stored. To begin this operation, the timing and control circuit 10 produces a COUNT signal having a variable time duration that is presettable by a timespan adjustment 26. The comparator network 12 includes a plurality of counters that are connected to synchronously receive the ANALOG INPUT signal and compare the amplitude of the same with predetermined reference voltages. The reference voltages are related so as to define predetermined amplitude ranges for the ANALOG INPUT signal. The reference voltages, and, hence, the amplitude ranges, can be varied and preset using an amplitude span adjustment 28. During the period of the COUNT signal, each of the comparators in the comparator network 12 is enabled to produce a digital comparator output signal each time the analog input signal exceeds the reference voltage associated with that comparator. Thus, for the time interval defined by the duration of the COUNT signal, the comparator network 12 produces a plurality of comparator output signals whose nature is related to the number of transitions of the incoming ANALOG INPUT signal through each of the plurality of amplitude ranges.

The output of each of the comparatos is supplied to a selected one of a plurality of event counters. In FIG. 1, only selected ones of the event counters (designated C0, CE, and CF) are shown for ease of illustration. It is to be understood that one such counter is provided for, and associated with, each of the comparators in the comparator network 12. With this arrangement, count data is developed separately for each of the amplitude ranges.

At the conclusion of the count cycle, the counts for each of the amplitude ranges are simultaneously stored in separate memory locations in a storage circuit that includes a plurality of event memories. One such event memory is provided for, and associated with, each of the event counters. For clarity of illustration, only selected ones of these event memories (designated M0, ME, MF) are shown. As will be understood from viewing FIG. 1, each event memory receives the count data from its associated event counter and stores the same in one of a plurality of storage locations during the write cycle of operation. To control and time this operation, the timing and control circuit 10 produces the following signals: WRITE, ADDRESS, $\overline{\text{STORE}}$; and a plurality of signals: BIN0 - BINF. As will be described more fully hereinafter, the WRITE signal is produced at the conclusion of the count cycle to initiate the write cycle. The BIN0 - BINF signals are a plurality of signals, one of which is provided for, and asociated with, each of the event memories M0 - ME, MF. The BIN0 - BINF signals are in the form of enabling signals that are combined with the WRITE signal in the gates 14 to produce signals that enable the various event memories. During the write cycle, each of the memories is enabled so that the entire set of count data is written simultaneously into the memories. The ADDRESS signal produced by the timing and control circuit controls the addresses of the event memories at which the count data is stored at any particular point in the sequence of operation. The ADDRESS signal is common to all memories so that for a given sequence of count and write cycles, the count data is stored in the respective event memories, but at the same addressable location.

According to an important aspect of the invention, the addresses of the event memories represent distinct time periods, or intervals, during which count data for individual analog input signals are stored. As will be described in detail hereinafter, after an initial analog input signal is analyzed, the timing and control circuit 10 increments the ADDRESS signal by 1 so that the count data for the next incoming analog input signal is stored in the event memories at the next successive address. Since the incrementing of the addresses occurs automatically at the conclusion of the write cycle, the pulse height counter is automatically readied to analyze each of a successively received series of analog input signals. As well, since this operation is not dependent upon the time between occurrences of pulses, the pulse height counter is particularly useful for analyzing transient events, or pulses that are anticipated to occur at unpredictable intervals, which may be closely or widely spaced during an overall time interval of indeterminate duration.

The signals produces by the gates 14 that enable the event memories are also used to reset the event counters C0 - CE, CF. The WRITE signal is the dominating signal from a control standpoint, both for the purposes of enabling the event memories and resetting the event counters. Thus, for the writing mode of operation, the WRITE signal effectively controls the enablement of the event memories so that the count data may be written therein. At the conclusion of the write cycle, the trailing edge of the WRITE signal simultaneously resets each of the event counters C0 - CE, CF so that new count data can be created when a subsequent input signal is received. This resetting of the counters occurs substantially simultaneously with the incrementing of the ADDRESS signal so that both the event counters and event memories are ready for analyzing the next input signal.

It will be appreciated that the count data stored in the event memories can be easily supplied to any suitable utilization device. For example, suitable electrical connections with the data outputs of the event memories can be provided so that the count data is automatically stored in nonvolatile mass storage media or transferred to a computer system.

In the embodiment of FIG. 1, the count data is visually displayed on count display 22 during a readout mode of operation. In this readout mode, the BIN0 - BINF signals dominate the WRITE signal from a control standpoint. In response to receipt of a READ LEVEL signal, the timing and control circuit 10 outputs one of the BIN0 - BINF signals. This causes the gates 14 to send out a memory enable signal for the one event memory that corresponds with the selected one of the BIN0 - BINF signals. This results in the data at the storage location denoted by the ADDRESS signal being transferred from the enabled memory and displayed on the count display 22. In the preferred arrangement, the common ADDRESS signal is held constant as the event memories are enabled in sequence for readout. Since the "addresses" represent separate time intervals during which the ANALOG INPUT signal was analyzed, this manner of readout provides a convenient manner for separately reviewing the count analysis for each of a series of transient events. To review the count data stored for a different transient event, the timing and control circuit 10 is caused to change the ADDRESS signal by receipt of a READ INTERVAL signal. In the preferred mode of operation, after all of the count data, i.e., the data stored in each of the memories, is read out from the storage locations corresponding to a given interval, i.e., denoted by a given one of the ADDRESS signals, the ADDRESS signal is incremented to the next "interval". Continuing in this fashion, the count data recorded during each succeeding interval is read out on an event memory-by-event memory basis. The level display 18 and interval display 20 are connected with the timing and control circuit 10 so that the count data can be visually correlated with the amplitude range and interval during which it was recorded. As will be discussed below, the level display 18 is connected to display the selected one of the BIN0 - BINF signal, while the interval display 20 is connected to display the ADDRESS signal. Any conventional display can be used for the level display 18, the interval display 20, and the count display 22. The manner of connecting and driving such displays is not critical to the invention and will be readily appreciated by those skilled in the art. It will be quite apparent that a single display could be used for displaying the count, level, and interval information.

During the readout mode of operation, it is desirable to disable the event memory so that data cannot be written therein. For this purpose, the timing and control circuit 10 produces a $\overline{\text{STORE}}$ signal that is applied to each of the event memories during readout. During the writing mode of operation, the logical state of the $\overline{\text{STORE}}$ signals is changed so that the count data can be written into the event memories.

The timing subsystem of the timing and control circuit 10 is shown in greater detail in FIG. 3. The TRIG- GER signal produced by trigger detector 16 is applied to a buffer 30. The buffer is a timer that produces a TRIGGER BUFFER pulse that has a duration that is longer than the overall time duration of the count and write cycles. The TRIGGER BUFFER pulse is applied to a count timer 32 that, in turn, produces the COUNT signal that is applied to the comparators of the comparator network 12. The timespan adjustment 26 is a variable resistance that determines the duration of the COUNT signal. The COUNT signal is also applied to a write timer 34, which controls the duration of the write cycle. As noted above, the write cycle is initiated at the conclusion of the count cycle. To accomplish this, the write timer 34 is triggered by the trailing edge of the COUNT signal. The write timer 34 produces the WRITE signal that is combined in the gates 14 with the BIN0 - BINF signals and applied to the event memories as a common write-enabling signal and is also applied to the event counters as a common reset signal.

At the conclusion of the write cycle, as determined by the duration of the WRITE signal, the count data for one transient event will have been stored in memory locations defined by the ADDRESS signal so that all such data for this event is stored in the same address but in different ones of the event memories. During the automatic reset operation that occurs at the conclusion of the write cycle, the ADDRESS signal is incremented by 1 so that the count data generated for the next transient event is stored in the event memories at storage locations defined by the next sequential ADDRESS signal. To effect this, the WRITE signal is applied to a one-shot multivibrator 36 that produces an INCREMENT ADDRESS signal. The INCREMENT ADDRESS signal causes an address counter 38 to increment by 1. This count is applied to a latch 40, whose output comprises the ADDRESS signal, which is supplied to the event memories during both the writing operation and readout. The ADDRESS signal is also applied to the interval display 20 so that it can be displayed during readout. As discussed above, during readout, the commonly shared ADDRESS signal is incremented by 1 so that the memories are stepped in sequence such that the count data stored in the various event memories during each of the various intervals can be recalled and displayed. To increment the ADDRESS signal by 1, a read interval pushbuttom 42 is depressed. This causes one-shot multivibrator 36 to produce an INCREMENT ADDRESS signal that, in turn, causes the address counter 38 to increment by 1 so that the ADDRESS signal is changed. As a result, the count data for the next substantially occurring analog input signal can be read from the event memories.

As will be discussed in conjunction with FIG. 3, the readout subsystem of the timing and control circuit 10 produces a signal that resets address counter 38 at the beginning of the readout mode of operation. This is done as a matter of convenience so that readout will begin with the first occuring analog input signal.

FIG. 3 is a block diagram of a readout control subsystem of the timing and control circuit 10. Although the subsystem shown is controlled by manually operated pushbuttons, it will be recognized that an automatic control system can easily be utilized instead. For readout, the level display 18, interval display 20, and count display 22 (FIG. 1) are connected to a source of power by closure of a display enable switch 44. A signal resulting from the depression of a read pushbutton 46 is applied to a read buffer 48 and a latch 50. The read buffer 48 is a timer whose output resets the address counter 38 (FIG. 2) and a bin counter 60. The output of latch 50 is the $\overline{\text{STORE}}$ signal, which is applied to the event memories to disable them from being written into during readout. An external reset pushbutton 52 is included so that the logical state of the $\overline{\text{STORE}}$ signal can be changed when readout is concluded and it is desired to return to the writing mode of operation. The output of the external reset pushbutton 52 is first buffered by reset buffer 54 before being applied to the latch 50. It will be observed that the output of the reset buffer 54 is also supplied as an input to the read buffer 48. In this manner, both the address counter 38 and the bin counter 60 are reset for the beginning of a new sequence of count and read cycles.

To increment through each of the event memories to read out the stored count data a read level pushbutton 56 is actuated. The pushbutton signal is buffered by buffer 58 and applied to bin counter 60. A parallel digital BIN COUNT signal is produced by the bin counter 60 and applied to a demultiplexer 62. The demultiplexer 62 decodes the BIN COUNT signal and produces a plurality of memory select pulses designated BIN0 - BINE, BINF. These memory select pulses correspond in number to, and are associated with, the plurality of event memories M0 - ME, MF. The memory select pulses are applied to the gates 14. In particular, each of the memory select signals is applied as an input to one of a plurality of AND gates designated G0 - GE, GF. The other input of each of the AND gates is the WRITE signal produced by the write timer 34 (see FIG. 2). As will be discussed in connection with FIG. 4, the outputs ENB0 - ENBE, ENBF of the AND gates G0 - GE, GF, respectively, are applied to an enable input of the event memories so that the memories may be selected one at a time or all together as required for reading or writing. For the readout mode of operation, the write signal is always high so that the one select pulse, i.e., one of the signals BIN0 - BINE, BINF, dominates from a control standpoint and selects only one of event memories to be read out. For the write mode of operation, the write signal is high and, as well, all of the select signals BIN0 - BINE, BINF are low so that all of the memories are enabled.

It will be seen that the BIN COUNT signal is also provided for display to the level display 18. Thus, as the various event memories are enabled for readout of the stored count data, the identifying number associated with the selected event memory, as denoted by the BIN COUNT signal, is shown on the level display 18 while the count data read from that memory is displayed on the count display 22.

Referring now to FIG. 4, the comparator network 12, the event counters C0 - CE, CF, and the event memories M0 - ME, MF, are shown in greater detail. The comparator network comprises: 16 high-speed voltage comparators designated VC0 - VCF; 16 NAND gates designated NG0 - NGF; two variable resistors designated R1 and R2; and eight resistors designated R3 - R10. As will be understood from viewing FIG. 4 and the following discussion, the comparator network is, in essence, a 16-"channel" comparator. Since the channels are substantially identical, for ease of illustration, only selected ones of the resistors, voltage comparators, and NAND gates are illustrated in FIG. 4. The nonillustrated resistors, voltage comparators, and NAND gates are connected in a manner similar to the connections for the illustrated elements, as will be readily appreciated by those familiar with digital logic design.

The incoming ANALOG INPUT signal that is transferred by the trigger detector 16 is connected to either the inverting or noninverting input of each of the voltage comparators VC0 - VCF as shown in FIG. 4. The other inputs, (noninverting or inverting) are connected either to the junctions of a positive voltage divider formed by variable resistor R1 and the "odd" numbered resistors R3 - R9 or to a negative voltage divider network formed by variable resistor R2 and the "even" numbered resistors R4 - R10. More specifically, variable resistor R1 and resistors R3 - R9 are connected in series in numerical order between ground and a reference voltage source designated +V and variable resistor R2 and resistors R4 - R10 are connected in series in numerical order between ground and a negative reference voltage source designated −V. The junction between variable resistor R1 and R3 is connected to the noninverting input of comparator VCF; the junction between variable resistor R2 and resistor R4 is connected to the inverting input of comparator VCE; and so on with the last connections connecting the junctions between resistor R9 and ground to the noninverting input of comparator VC1 and the junction between resistor R10 and ground to the inverting input of comparator VC0. As will be readily appreciated from the foregoing description, the voltage comparators are arranged in two series of comparators. Eight of the comparators, i.e., VC1 - VCD, VCF compare the ANALOG INPUT signal with positive voltage thresholds while eight of the voltage comparators, i.e., VC0 - VCC, VCE compare the ANALOG INPUT signal with negative voltage thresholds. The fixed resistors R3 - R9 are selected so that each successive positive threshold is 6 dB more removed from zero than the previous threshold. Similarly, the fixed resistors are R4 - R10 are selected so that each successive negative threshold is 6 dB more removed from zero than the previous threshold. Each of the comparators produces an output signal, i.e., a logical level shift, whenever the ANALOG INPUT signal exceeds the reference voltage applied to that comparator. Since the reference voltages are steprelated so as to define successive amplitude ranges, the outputs of the comparators provide an indication of each excursion of the ANALOG INPUT signal through these amplitude ranges. The incremental division between the amplitude ranges can, of course, be easily changed by varying the value of the individual resistors. To avoid the necessity of changing the resistors, the variable resistors R1 and R2 are provided so that the voltage thresholds can be adjusted. In this regard, resistors R1 and R2 comprise the amplitude span adjustment 28 of FIG. 1.

The COUNT signal produced by the counter timer 32 (FIG. 2) is utilized to control the transfer of the outputs of the voltage comparators VC0 - VCF to the event counters C0 - CF. This is accomplished by applying the COUNT signal to one input of each of the NAND gates NG0 - NGF. The output of each voltage comparator VC0 - VCF is connected to the other input of one of the NAND gates NG0 - NGF. More specifically, one NAND gate is provided for, and connected to receive, the output of each of the voltage comparators. Thus, the output of VCF is connected to one input of NGF, the output of VCE is connected to one input of NGE, and so, with the last such connection being the output of VC0 connected with one input of NG0. In operation, during the duration of the COUNT signal, the output of each voltage comparator VC0 - VCF is gated through to the data input CP of the one of the event counters C0 - CF, which is associated with that comparator. Thus, the output of VCF is transferred to CF, the output of VCE is transferred to CE, and so on, with the last transfer being the transfer of the output of VC0 to C0.

During the count cycle, i.e., during the duration of the COUNT signal, the event counters C0 - CF count the amplitude excursions of the ANALOG INPUT signal through the amplitude ranges defined by the reference voltages applied to the voltage comparators VC0 - VCF. As noted above, at the conclusion of the count cycle, the COUNT signal shifts high turning the NAND gates "off" so that no further counts can be registered by the event counters C0 - CF. As will be understood from viewing the COUNT and WRITE signal lines in FIG. 5, the trailing edge of the COUNT signal triggers the write timer 34 so that the WRITE signal is produced. This initiates the write cycle during which the counts in each of the event counters C0 - CF are transferred to the one of the event memories M0 - MF associated with that counter. As discussed in conjunction with FIG. 3, the WRITE signal is combined in an AND operation in the gates 14 to produce the memory-enabling signals ENB0 - ENBF. These enabling signals are applied to the enable input of the event memories M0 - MF so that the counts can be written into the storage locations defined by the common ADDRESS signal. For clarity of illustration, the address lines over which the ADDRESS signal is commonly applied to the event memories M0 - MF are not shown in FIG. 4. These connections will be readily understood by referring to FIG. 1 and the discussion above. As also noted above, during the write cycle of operation, each of the event memories M0 - MF is enabled by its respective enabling signal ENB0 - ENBF so that writing of the counts into the storage locations occurs simultaneously.

With reference again to FIG. 5, it is to be noted that the WRITE signal (and hence the write cycle) is of short duration relative to the duration of the COUNT signal (and hence the count cycle). Although shown somewhat enlarged for illustrative purposes, the WRITE signal has a duration of approximately ten microseconds while the COUNT signal has a duration of approximately one second. The duration of the count signal is variable so that count data for the ANALOG INPUT signal can be developed over periods of greater or lesser extent. The write cycle is, however, maintained as short as possible so that the writing of the count data into the event memories can proceed rapidly and, thereafter, the system can quickly reset itself to be ready to analyze another incoming signal.

As discussed above, during the readout mode of operation, the event memories M0 - MF are disabled from being written into, while being enabled for readout purposes. This is effected by applying the $\overline{\text{STORE}}$ signal produced at the output of latch 50 (FIG. 3) to the write input of each of the event memories M0 - MF, while applying the memory-enabling signals ENB0 - ENBF to the enable input of these memories.

Figure 5:
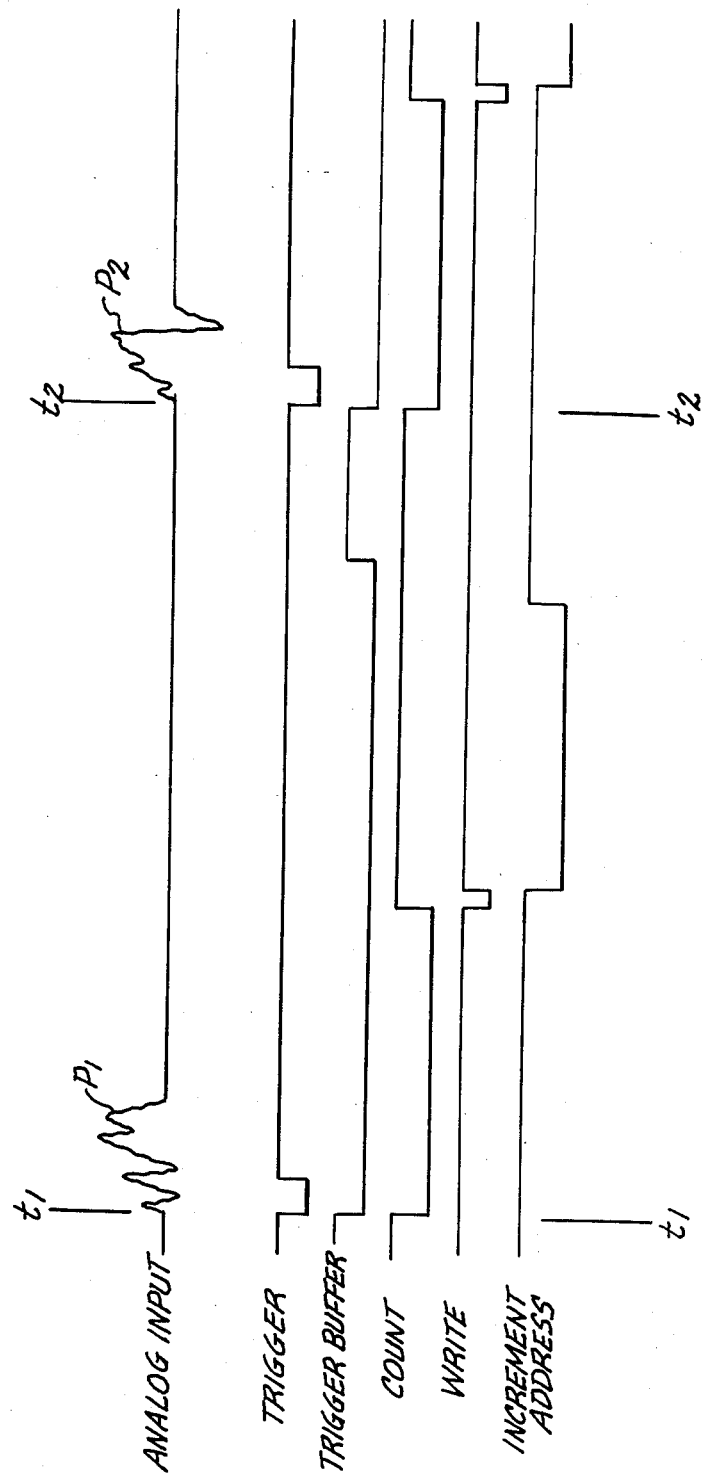
FIG. 5 is a timing diagram used to assist in describing the operation of the pulse height counter.

The cyclical operation of the pulse height counter and the automatic resetting thereof can be understood with reference to FIG. 5. On the uppermost line designated ANALOG INPUT, two transient pulses P1 and P2 occur beginning at times $t_1$ and $t_2$, respectively. The times $t_1$ and $t_2$ need not be related, i.e., the transient pulses may occur at random intervals that are spaced either close together or far apart. Considering pulse P1, when the amplitude thereof exceeds the threshold of trigger detector 16, the TRIGGER signal is produced causing, in turn, production of the TRIGGER BUFFER signal that is applied to the count time 32. This causes the count timer to produce the COUNT signal that is applied to the NAND gates NG0 - NGF to transfer the output of the voltage comparators VC0 - VCF to the event counters C0 - CF. The trailing edge of the count signal disables the transfer of the outputs of the voltage comparators to the counters terminating the count cycle. Immediately after the rising, or trailing, edge of the COUNT signal, the WRITE signal is produced by the write timer. The falling, or leading, edge of the WRITE signal initiates the write cycle by enabling the event memories M0 - MF. The rising, or trailing, edge of the WRITE signal terminates the write cycle by disabling the event memories M0 - MF. More specifically, the WRITE signal produces a logical state for the enabling signals ENB0 - ENBF. The trailing edge of the WRITE signal is also applied to the master reset inputs designated MR of the event counters C0 - CF. Thus, substantially simultaneously with the termination of the write cycle, the counters are readied for receipt of the subsequent incoming pulse P2. As well, immediately after the WRITE signal ends, the INCREMENT ADDRESS signal is produced by one-shot 36 to cause the address counter 38 to increment by 1. This results in the ADDRESS signal being incremented by 1 and applied to the event memories, stepping the same to the next successive storage location. Thereafter, at time $t_2$ when pulse P2 is received, the cyclic operation is repeated. Thus, count data is generated for this pulse and stored in the next successive memory location of each of the event memories.

In the presently preferred embodiment, 16 separate "addresses" are provided for each of the event memories. The pulse height counter can, thus, analyze either 16 separate pulses or an incoming analog signal at 16 distinct intervals. Since there are also 16 event memories, there is formed a storage matrix that is 16×16, i.e., 16 eight-bit storage locations by 16 intervals, or time durations.

It will be appreciated from the foregoing description that the invention provides a pulse height counter adapted to count the number of excursions of an incoming analog signal through each of a plurality of amplitude ranges. The pulse height counter automatically records not only the number of excursions through each amplitude level, but also records the number of amplitude excursions for each of a plurality of intervals. Since the write cycle, the resetting of the counters, and incrementing of the common ADDRESS signal occur automatically and quite rapidly, the pulse height counter is well suited for applications that require high-speed, recycling operation. Importantly, the speed of the counter is limited only by the bandwidth response of the comparators and the maximum clock rate of the counters. This eliminates the need for a high-speed, and high-cost, memory scheme. For example, in an experimental counter constructed in accordance with the invention, comparators having a maximum bandwidth of 55 MHz, counters having a maximum clock rate of 35 MHz, and memories having a modest 10 microsecond minimum safe write time were utilized. Even with the relatively slow memories, it is theoretically possible with this device to accurately sample 35 MHz input signals.

Advantageously, only standard, inexpensive components are required so that the pulse height counter can be manufactured in a cost-effective manner. The recorded data may be either periodically read out and displayed manually or applied to a storage medium, such as a magnetic tape or disc, for storage and display at a later time. Still further, the pulse height counter can be easily adapted so that the stored information can be transferred to a computer system.

While the preferred embodiment of the invention has been illustrated and described, it will be appreciated that various changes can be made without departing from the spirit and scope of the invention. For example, a comparator network, other than one using voltage comparators and NAND gates can be used, if desired. Further, rather than utilizing timers for the timing circuit, a clock-based timing subsystem can be employed. Also, a larger matrix, either in terms of the number of event memories or the number of addresses or both, as well as larger data words can be used. Hence, the invention can be practiced otherwise than as specifically described herein.

The embodiments of the invention in which an exclusive property or privilege is claimed are defined as follows:

1. A pulse height counter, comprising:
   a comparison circuit having a plurality of comparators connected to synchronously receive an analog input signal, each of said comparators comparing the amplitude of said analog input signal with a predetermined reference voltage and, in accordance therewith, producing a comparator output signal, the reference voltages of said comparators being related so as to define predetermined amplitude ranges for said analog input signal;
   a counting circuit connected to said comparison circuit to synchronously receive the comparator output signal of each of said comparators and, in accordance therewith, produce a set of count data that indicates the number of occurrences of said analog input signal within each of said predetermined amplitude ranges;
   a storage circuit having a plurality of data bins, there being a plurality of data bins for each of said predetermined amplitude ranges, said data bins being arranged in groups that are defined by sequential addresses, each of said addresses corresponding to a predetermined time duration, said storage circuit being connected to receive said set of count data and store the count data for each of said predetermined amplitude ranges in a separate one of said bins; and
   timing and control means for receiving said analog input signal and, in response to receipt thereof, in sequence: (a) enabling said counting circuit to receive the comparator output signals of said comparators and produce said set of count data; (b) disabling said counting circuit from receiving said count data; (c) causing said storage circuit to store said count data in the group of data bins corresponding to the first one of said addresses; and (d) changing said address to the next sequential address and repeating operations (a), (b), and (c) in sequence to cause said storage circuit to store count data for the next time duration in the next group of data bins.

2. The pulse height counter of claim 1, wherein said counting circuit includes a plurality of resettable counters, one of said counters being associated with each of said plurality of comparators, each of said resettable counters being connected to receive the comparator output signal from its associated comparator and, in accordance therewith, produce the count data for one of said predetermined amplitude ranges.

3. A pulse height counter comprising:

a comparison circuit having a plurality of comparators connected to synchronously receive an analog input signal, each of said comparators comparing the amplitude of said analog input signal with a predetermined reference voltage and, in accordance therewith, producing a comparator output signal, the reference voltages of said comparators being related so as to define predetermined amplitude ranges for said analog input signal;

a counting circuit connected to said comparison circuit to synchronously receive the comparator output signal of each of said comparators and, in accordance therewith, produce a set of count data that indicates the number of occurrences of said analog input signal within each of said predetermined amplitude ranges; and a storage circuit having a plurality of memories, said storage circuit being connected to receive said set of count data and store the count data for eachh of said predetermined amplitude ranges in a separate one of said memories, one of said memories being associated with each of said plurality of counters, each of said memories having a plurality of storage locations, each of said storage locations being defined by an address, said addresses being shared by said memories so that the count data for each of said predetermined amplitude ranges is stored at the same address but in a separate one of said memories.

4. The pulse height counter of claim 3, wherein said timing and control means includes:

a count timer, said count timer being triggered by the receipt of said analog input signal to produce a count signal that is applied to said comparison circuit to cause the transfer of said comparator output signals to said counters during a count time interval; and a write timer connected to receive said count signal and, in accordance therewith, produce a write signal, said write signal being applied to said plurality of memories to enable said plurality of memories to store said count data at said addresses during a write time interval, said write time interval being subsequent to said count time interval, said write signal being applied to said counters to reset said counters upon conclusion of said write time interval.

5. The pulse height counter of claim 4, wherein said timing and control circuit includes an address counter, said address counter being connected to receive said write signal and, in accordance therewith, produce a common address signal related to the addresses of the plurality of storage locations included in said memories, said common address signal being applied to each of said memories.

6. A pulse height counter, comprising:

a comparison circuit having a plurality of comparators connected to synchronously receive a train of individual transient pulses, each of said comparators comparing the amplitude of said transient pulses with a predetermined reference voltage and, in accordance therewith, producing a comparator output signal, the reference voltages of said comparators being related so as to define predetermined amplitude ranges for said transient pulses;

a counting circuit connected to said comparison circuit to synchronously receive the comparator output signal of each of said comparators and, in accordance therewith, produce a set of count data that indicates the number of occurrences of said transient pulses within each of said predetermined amplitude ranges, said counting circuit including a plurality of resettable counters, one of said counters being associated with each of said plurality of comparators, each of said resettable counters being connected to receive the comparator output signal from its associated comparator and, in accordance therewith, produce the count data for one of said predetermined amplitude ranges;

a storage circuit having a plurality of memories, said storage circuit being connected to receive said set of count data and store the count data for each of said predetermined amplitude ranges in a separate one of said memories, one of said memories being associated with each of said plurality of counters, each of said memories having a plurality of storage locations, each of said storage locations being defined by an address, said addresses being shared by said memories so that the count data of said predetermined amplitude ranges is stored at the same address but in a separate one of said memories; and timing and control means for receiving said transient pulses and, in response to receipt thereof, in sequence: (a) enabling said counting circuit to receive the comparator output signals of said comparators and produce said set of count data; (b) disabling said counting circuit from receiving said count data; and (c) causing said storage circuit to store said count data in said memories, said timing and control means including:

a count timer, said count timer being triggered by the receipt of each of said transient pulses to produce a count signal that is applied to said comparison circuit to cause the transfer of said comparator output signals to said counters during a count time interval;

a write timer connected to receive each of said count signals and, in accordance therewith, produce a write signal, said write signal being applied to said plurality of memories to enable said plurality of memories to store said count data at said addresses during a write time interval, said write time interval being subsequent to said count time interval, said write signal being applied to said counters to reset said counters upon conclusion of said write time interval; and an address counter, said address counter being connected to receive said write signals and, in accordance therewith, produce a plurality of common address signals related to the addresses of the plurality of storage locations included in said memories, said common address signals being applied to each of said memories, said common address signals being changed in sequence upon receipt of said write signals to advance each of the memories in said storage circuit to its next storage location so that the count data for each of said transient pulses is stored in stepped sequence in particular storage locations in said memories, said storage locations being related to said common address signals.

7. The pulse height counter of claim 6, further including readout means connected to said address counter and to said memories for sequentially reading out the count data stored in each of the storage locations of said memories.

* * * * *

UNITED STATES PATENT AND TRADEMARK OFFICE
CERTIFICATE OF CORRECTION

PATENT NO. : 4,670,711
DATED : June 2, 1987
INVENTOR(S) : Daniels

It is certified that error appears in the above-identified patent and that said Letters Patent is hereby corrected as shown below:

| | |
|---|---|
| Column 4, Line 63: | "comparatos" should be --comparators-- |
| Column 5, Line 57: | "produces" should be --produced-- |
| Column 8, Line 37: | "write" should be --WRITE-- |
| Column 8, Line 41: | Insert --the-- before "event" |
| Column 8, Line 42: | "write" should be --WRITE-- |
| Column 9, Line 37: | Delete "are" (first occurrence) |
| Column 9, Line 67: | Insert --on--after "so" |
| Column 11, Line 6: | "time" should be --timer-- |
| Column 13, Line 25: (Claim 3, Line 20) | "eachh" should be --each-- |
| Column 14, Line 26: (Claim 6, Line 34) | Insert --each of--before "said" (second Occurrence) |

Signed and Sealed this

Seventeenth Day of November, 1987

Attest:

DONALD J. QUIGG

Attesting Officer

Commissioner of Patents and Trademarks